United States Patent
Park et al.

(10) Patent No.: US 11,965,475 B2
(45) Date of Patent: Apr. 23, 2024

(54) ASSEMBLY FOR FUEL INJECTOR AND COATING METHOD FOR THE SAME

(71) Applicant: HYUNDAI KEFICO CORPORATION, Gyeonggi-do (KR)

(72) Inventors: Heonjoon Park, Uiwang-si (KR); Sungchul Cha, Seoul (KR)

(73) Assignee: Hyundai Kefico Corporation, Gyeonggi-do (KR)

( * ) Notice: Subject to any disclaimer, the term of this patent is extended or adjusted under 35 U.S.C. 154(b) by 481 days.

(21) Appl. No.: 17/281,863

(22) PCT Filed: Apr. 17, 2020

(86) PCT No.: PCT/KR2020/005151
§ 371 (c)(1),
(2) Date: Mar. 31, 2021

(87) PCT Pub. No.: WO2020/213979
PCT Pub. Date: Oct. 22, 2020

(65) Prior Publication Data
US 2021/0396200 A1    Dec. 23, 2021

(30) Foreign Application Priority Data
Apr. 18, 2019    (KR) ........................ 10-2019-0045705

(51) Int. Cl.
| | | |
|---|---|---|
| *F02M 61/16* | (2006.01) | |
| *C23C 14/00* | (2006.01) | |
| *C23C 14/02* | (2006.01) | |
| *C23C 14/06* | (2006.01) | |
| *C23C 14/08* | (2006.01) | |

(52) U.S. Cl.
CPC ......... *F02M 61/16* (2013.01); *C23C 14/0057* (2013.01); *C23C 14/022* (2013.01); *C23C 14/024* (2013.01); *C23C 14/0611* (2013.01); *C23C 14/08* (2013.01); *F02M 2200/9038* (2013.01); *F02M 2200/9046* (2013.01)

(58) Field of Classification Search
None
See application file for complete search history.

(56) References Cited

U.S. PATENT DOCUMENTS

2002/0050536 A1    5/2002    Imoehl

FOREIGN PATENT DOCUMENTS

| EP | 3643810 A1 * | 4/2020 | ........... B05B 1/3046 |
|---|---|---|---|
| JP | H0625826 A | 2/1994 | |
| JP | 2002371351 A | 12/2002 | |
| JP | 4045990 B2 | 2/2008 | |
| KR | 830003938 A | 6/1983 | |

(Continued)

*Primary Examiner* — Jeffrey D Washville
(74) *Attorney, Agent, or Firm* — Fox Rothschild LLP

(57) ABSTRACT

An assembly for a fuel injector includes a base material, a coated region formed on a surface of the base material, an uncoated region formed on a surface of the base material, in contact with and supported by a jig, and formed to be partitioned from the coated region so as to prevent the coated region from peeling off during laser welding, and a coating material stacked in a multilayer structure on the coated region. As a result, friction reduction, high hardness, impact resistance, heat resistance, and durability of the assembly may be improved, and a portion requiring the coating may be precisely coated.

16 Claims, 11 Drawing Sheets

(56) References Cited

FOREIGN PATENT DOCUMENTS

| | | | |
|---|---|---|---|
| KR | 2006-0024468 A | 3/2006 | |
| KR | 2019-0000789 A | 1/2019 | |
| WO | 2012/144682 A1 | 10/2012 | |

\* cited by examiner

ASSEMBLY FOR FUEL INJECTOR AND COATING METHOD FOR THE SAME

BACKGROUND

(a) Technical Field

The present disclosure relates to an assembly for a fuel injector and a coating method thereof, more particularly, to the assembly for the fuel injector in which a coating material for reducing frictional resistance and increasing coating hardness and durability is stacked.

(b) Description of the Related Art

A fuel injector for a vehicle is a key component that serves to supply fuel to an engine at appropriate timing, depending on a stroke of the engine.

The fuel injection typically includes a sliding component such as a ball and a valve seat, which have been miniaturized, but are exposed to a high and repetitive load and stress. As a result, a lifespan of the ball and the valve sheet may be reduced due to thermal shock, abrasion, etc.

As a method for improving abrasion resistance of such a sliding component, there is a method of forming a bonding layer on a base material of the sliding component, forming a support layer on a surface of the bonding layer, and forming a functional layer on a surface of the support layer to improve abrasion resistance and heat resistance of the sliding component.

Japanese Patent Laid-Open Publication No. 1994-25826 discloses a configuration of a sliding member in which a Mo-based material is used as a coating material.

The above document discloses an ion plating type physical deposition method of depositing Mo ions evaporated using a high-energy beam on a base material to form a Mo film, in relation to a deposition method of the Mo-based material.

However, in the case of the deposition method disclosed in the above document, non-ionic particles having a relatively large diameter as well as Mo ion particles evaporated from a Mo target by the high-energy beam are deposited on the base material, such that non-uniformity of the deposited particles may be generated, resulting in deterioration of a roughness of a coating film and deterioration of a bonding force to the base material. As a result, there is a problem in that durability of the coating film may be significantly reduced.

SUMMARY

The present disclosure provides an assembly for a fuel injector in which friction reduction, high hardness, impact resistance, heat resistance, and durability are improved by partitioning a coated region and an uncoated region from each other.

The present disclosure also provides a coating method of an assembly for a fuel injector that can enable precise coating on a required portion of a subminiature component.

One aspect of the present disclosure is directed to an assembly for a fuel injector, including: a base material having a coated region and an uncoated region formed on a surface thereof, and a coating material stacked in a multilayer structure on the coated region, wherein the coating material includes: a bonding layer stacked on the coated region of the base material, a support layer stacked on an outer surface of the bonding layer, and a silicon monoxide, diamond-like carbon (SiO-DLC) functional layer stacked on an outer surface of the support layer.

The SiO-DLC functional layer may be stacked in a reactive sputtering manner.

The SiO-DLC functional layer may be formed by physically depositing a solid graphite as a target material, and at the same time, injecting a hydrocarbon gas and a siloxane gas.

The bonding layer and the support layer may be stacked by a physical deposition method.

The support layer may be stacked in a reactive sputtering manner.

The uncoated region may be in contact with and supported by a jig, and may be formed to be partitioned from the coated region so as to prevent the coated region from peeling off during laser welding.

The jig may include a support portion having one end in an axial direction with and by which the base material having a spherical shape is in contact and is supported and provided so as to form the uncoated region in the base material, and an attractive force generating portion disposed on an opposite side of the support portion in the axial direction and generating a magnetic force so as to mount the base material.

The support portion may include a support portion body formed in a cylindrical shape at a predetermined thickness, and a masking surface formed at one end of the support portion body in the axial direction and concavely formed so as to be in surface-contact with the base material to form the uncoated region on the base material.

The support portion may further include an extending surface extending radially from the masking surface so as to increase an area of the support portion supporting the base material.

The attractive force generating portion may be inserted into and provided in an opposite end of the support portion in an axial direction.

The support portion may have an outer diameter larger than 0.8 mm and smaller than a diameter of the base material.

The support portion may have a thickness of between about 0.2 mm and 1.0 mm.

Another aspect of the present disclosure is directed to a coating method of an assembly for a fuel injector that stacks a coating material having a multilayer structure on a surface of a base material of an assembly for the fuel injector, the method comprising: a base material mounting step of mounting the base material on a jig so as to partition a coated region and an uncoated region of the base material from each other, a bonding layer forming step of stacking a bonding layer on an outer peripheral surface of the base material, a support layer forming step of stacking a support layer on an outer surface of the bonding layer, and a functional layer forming step of stacking an SiO-DLC functional layer on an outer surface of the support layer in a reactive sputtering manner.

In the functional layer forming step, the SiO-DLC functional layer may be formed using a solid graphite, a hydrocarbon gas, and a siloxane gas.

In the functional layer forming step, a solid graphite may be deposited as a target material in a PVD (physical vapor deposition) manner, and at the same time, a hydrocarbon gas and a siloxane gas may be injected as a reactive gas.

In the bonding layer forming step and the support layer forming step, the bonding layer and the support layer may be stacked by a physical deposition method.

In the support layer forming step, the support layer may be stacked in a reactive sputtering manner.

The coating method may further include: a vacuum forming step of maintaining an internal atmosphere of a reaction chamber in a vacuum state in a state where the base material is disposed in the reaction chamber, after the base material mounting step; a plasma forming step of forming a plasma state where argon (Ar) ions are generated, by injecting an argon (Ar) gas into the reaction chamber and raising a temperature of the reaction chamber; and a cleaning step of cleaning a surface of the base material by colliding the Ar ions with the surface of the base material.

In the base material mounting step, the base material may be fixed by a magnetic force of the jig.

As described above, with an assembly for a fuel injector and a coating method thereof according to the present disclosure, friction reduction, high hardness, impact resistance, heat resistance and durability of the assembly for a fuel injector are improved, and a portion requiring the coating may be precisely coated.

DETAILED DESCRIPTION

Figure 1:
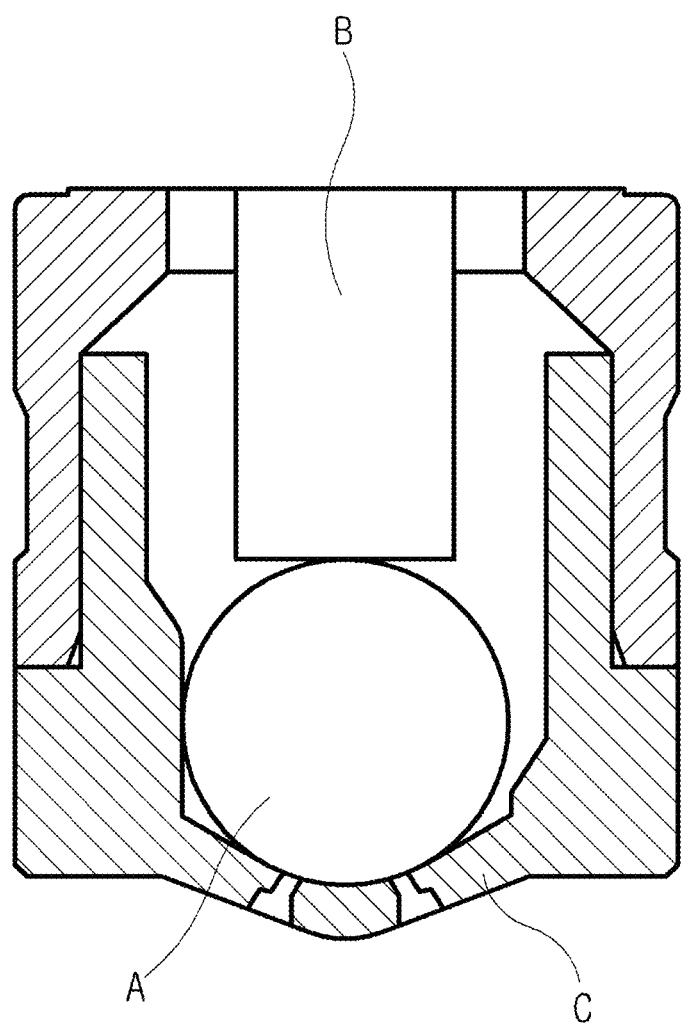
FIG. 1 is a partially enlarged view of a fuel injector including an assembly for a fuel injector according to an embodiment of the present disclosure.

It is understood that the term "vehicle" or "vehicular" or other similar term as used herein is inclusive of motor vehicles in general such as passenger automobiles including sports utility vehicles (SUV), buses, trucks, various commercial vehicles, watercraft including a variety of boats and ships, aircraft, and the like, and includes hybrid vehicles, electric vehicles, plug-in hybrid electric vehicles, hydrogen-powered vehicles and other alternative fuel vehicles (e.g. fuels derived from resources other than petroleum). As referred to herein, a hybrid vehicle is a vehicle that has two or more sources of power, for example both gasoline-powered and electric-powered vehicles.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Throughout the specification, unless explicitly described to the contrary, the word "comprise" and variations such as "comprises" or "comprising" will be understood to imply the inclusion of stated elements but not the exclusion of any other elements. In addition, the terms "unit", "-er", "-or", and "module" described in the specification mean units for processing at least one function and operation, and can be implemented by hardware components or software components and combinations thereof.

Further, the control logic of the present disclosure may be embodied as non-transitory computer readable media on a computer readable medium containing executable program instructions executed by a processor, controller or the like. Examples of computer readable media include, but are not limited to, ROM, RAM, compact disc (CD)-ROMs, magnetic tapes, floppy disks, flash drives, smart cards and optical data storage devices. The computer readable medium can also be distributed in network coupled computer systems so that the computer readable media is stored and executed in a distributed fashion, e.g., by a telematics server or a Controller Area Network (CAN).

Hereinafter, preferred embodiments of the present disclosure will be described in detail with reference to the accompanying drawings.

Since the present disclosure may be variously modified and have several exemplary embodiments, specific exemplary embodiments will be illustrated in the accompanying drawings and be described in detail in a detailed description. It is to be construed that the present disclosure is not limited to a specific exemplary embodiment, but includes all modifications, equivalents, and substitutions without departing from the scope and spirit of the present disclosure.

In describing the present disclosure, the terms such as "first" and "second" may be used to describe various components, but the components may not be limited by the terms. The terms are used only to distinguish one component from another component. For example, a first component may be referred to as a second component and the second component may also be similarly referred to as the first component, without departing from the scope of the present disclosure.

It will be understood that when one component is referred to as being "connected to" or "coupled to" another component, it may be connected directly to or coupled directly to another component or be connected to or coupled to another component, having the other component intervening therebetween. On the other hand, it will be understood that when one component is referred to as being "connected directly to" or "coupled directly to" another component, it may be connected to or coupled to another component without the other component interposed therebetween.

Terms used in the specification are used only in order to describe specific exemplary embodiments rather than limiting the present disclosure. Singular forms may include plural forms unless the context clearly indicates otherwise.

Unless defined otherwise, it is to be understood that all the terms used in the present specification including technical and scientific terms have the same meanings as those that are generally understood by those skilled in the art. Terms defined by a generally used dictionary may be interpreted as having meanings coinciding with the meanings within a context of the related art, and may not be ideally or excessively formally interpreted unless clearly defined otherwise in the present specification.

In addition, the examples below are provided to more completely explain to those with average knowledge in the art, and the shape and size of elements in the drawings can be exaggerated for clearer explanation.

FIG. 1 is a partially enlarged view of a fuel injector to which an assembly for a fuel injector according to the present disclosure is applied.

Referring to FIG. 1, the fuel injector includes a house housing a needle, a valve seat C formed at a lower end of the house, and a ball A disposed between the valve seat C and the needle B. The valve seat C has a valve seat surface on which the ball A is seated, and the valve seat C is provided with a nozzle penetrating the valve sheet C in a fuel injection direction.

The needle B causes the nozzle formed in the valve seat C to be opened and closed while moving the ball (A) in a vertical direction by an action of a magnetic coil (not illustrated) and a return spring (not illustrated).

The ball A having a spherical shape is illustrated in FIG. 1, but the present disclosure is not limited thereto, and a valve body having various shapes may be applied without limitation in addition to the spherical shape, all of which fall within the scope of the present disclosure. For convenience, an embodiment regarding the ball A having the spherical shape will hereinafter be mainly described.

The fuel injector, particularly, a direct injective-type fuel injector injects fuel directly into a cylinder. Therefore, the ball A and the valve seat C are exposed to high temperature and high-pressure conditions, and it is likely that a phenomenon such as nozzle clogging due to combustion by-products such as carbon monoxide and soot will occur.

As such, the ball A and the valve seat C are exposed to the high temperature and high-pressure conditions, and may be easily broken due to high frictional resistance caused by the combustion by-products. Thus, the present disclosure is configured to reduce frictional resistance, increase durability, and increase heat resistance by stacking a coating material having a multilayer structure on a base material 100 of the ball A and the valve seat C, as illustrated in FIG. 2.

Figure 2:
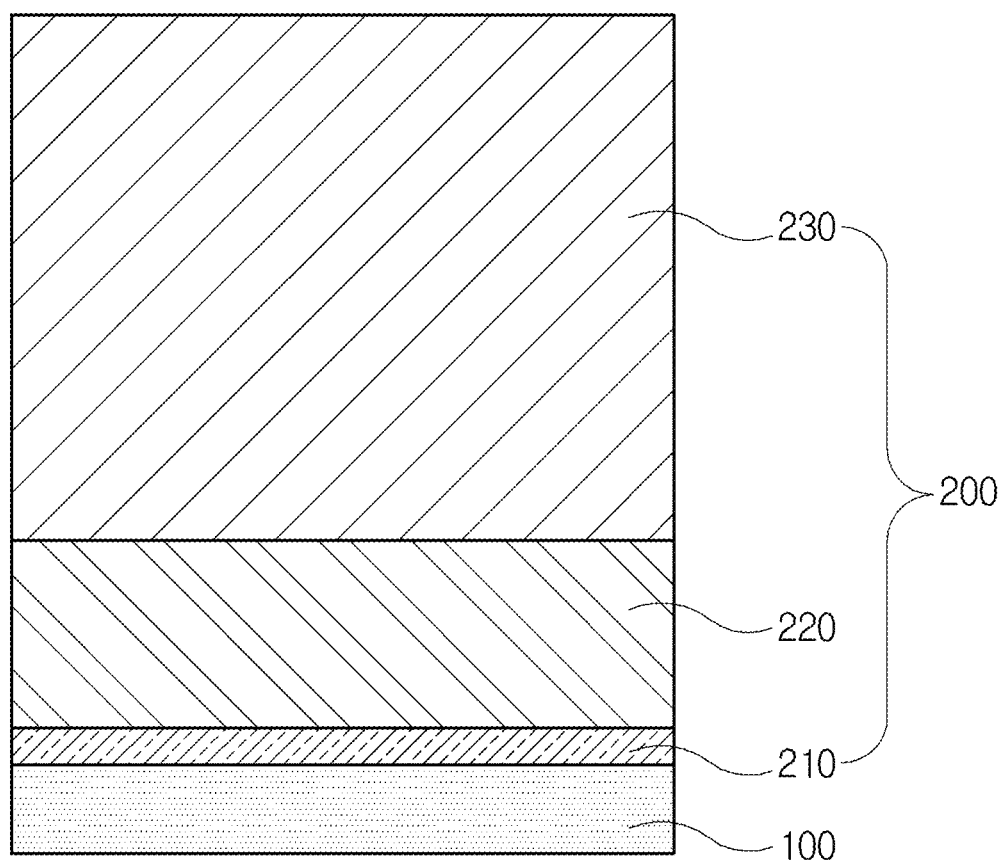
FIG. 2 is a schematic cross-sectional view of the assembly for a fuel injector in which a coating material deposited according to an embodiment of the present disclosure is stacked.
Figure 3:
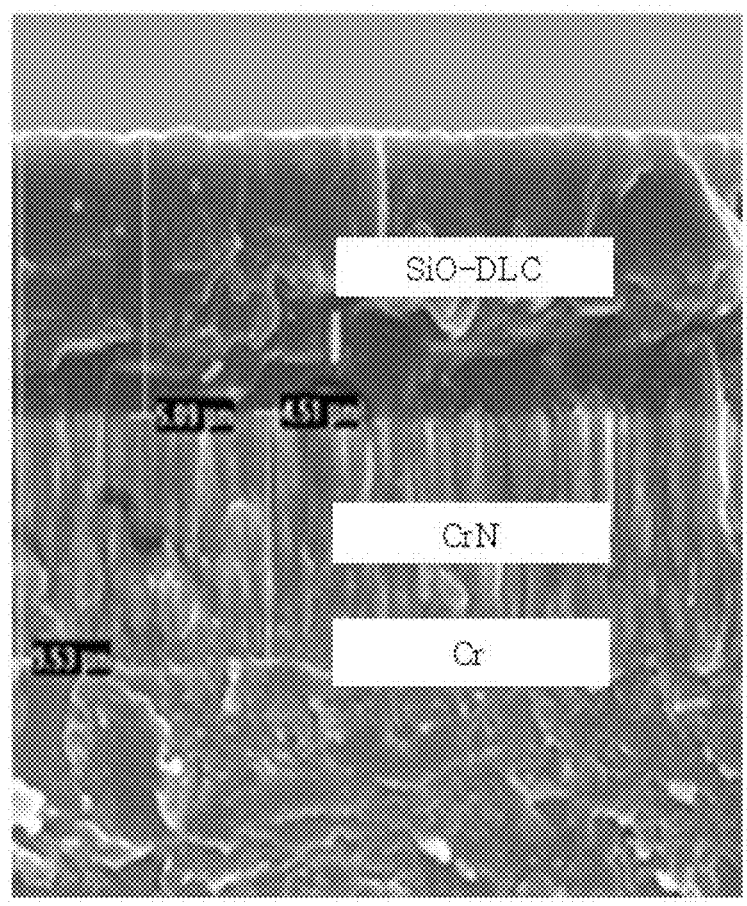
FIG. 3 is a scanning electron microscope (SEM) photograph of the coating material deposited according to an embodiment of the present disclosure.
Figure 4:
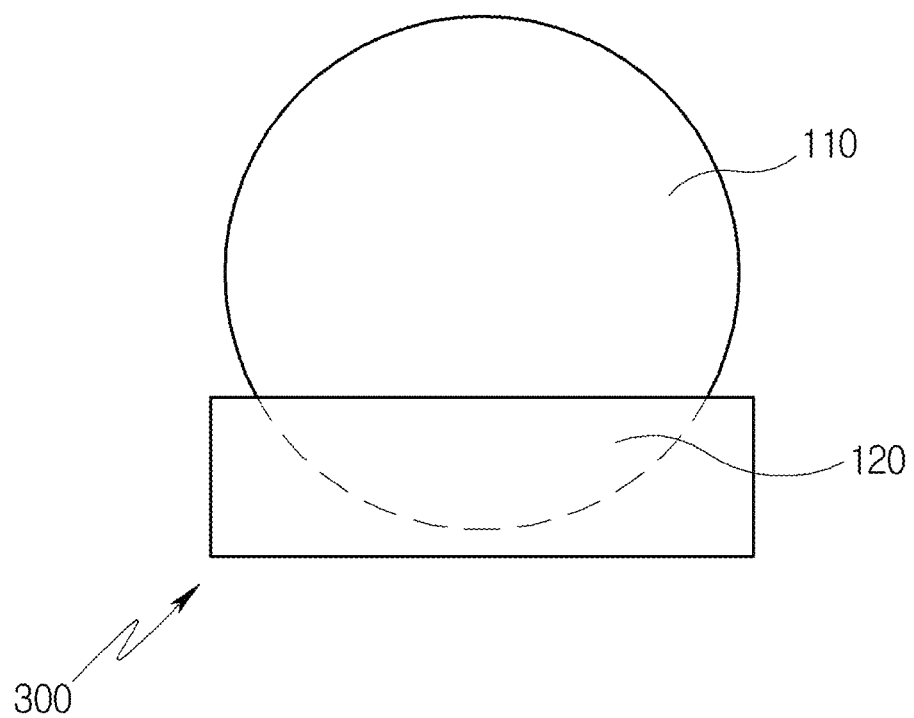
FIG. 4 is a schematic view for describing a method of partitioning a base material into a coated region and an uncoated region according to an embodiment of the present disclosure.

Referring to FIGS. 2 to 4, the assembly for a fuel inject according to an embodiment of the present disclosure includes a base material 100 and a coating material 200, wherein the base material 100 includes a coated region 110 and an uncoated region 120, and the coating material 200 includes a bonding layer 210, a support layer 220, and an SiO-DLC functional layer 230.

In this case, the base material 100 is partitioned into the coated region 110 in which the coating material 200 is stacked on a surface thereof and the uncoated region 120 in contact with a coating jig 300 and on which the coating material is not stacked.

A structure and a function of the jig 300 will be described below with reference to FIG. 5.

Meanwhile, the base material 100 was formed in a spherical shape so as to be used for the injector ball in the present embodiment, but is not limited thereto, and may be formed in various shapes so as to be applicable to various components used in an injector valve seat and a high-pressure pump.

In addition, in the present embodiment, the coating material 200 is stacked in a multilayer structure on the surface of the base material 100 of the assembly for a fuel injector, and includes the bonding layer 210 stacked on a surface of the coated region 110, the support layer 220 stacked on an outer surface of the bonding layer 210, and the SiO-DLC functional layer 230 stacked on an outer surface of the support layer 220.

Meanwhile, Cr is used as a material of the bonding layer 210 and CrN is used as a material of the support layer 220 in the present embodiment, but the materials of the bonding layer 210 and the support layer 220 are not limited thereto. For example, Mo may be used as the material of the bonding layer 210 and MoN may be used as the material of the support layer 220 or Mo may be used as the material of the bonding layer 210 and WC may be used as the material of the support layer 220.

In this case, the bonding layer 210 and the support layer 220 are stacked by a physical deposition method, preferably a physical vapor deposition (PVD), and the SiO-DLC functional layer 230 is stacked by a reactive sputtering method.

Figure 11:
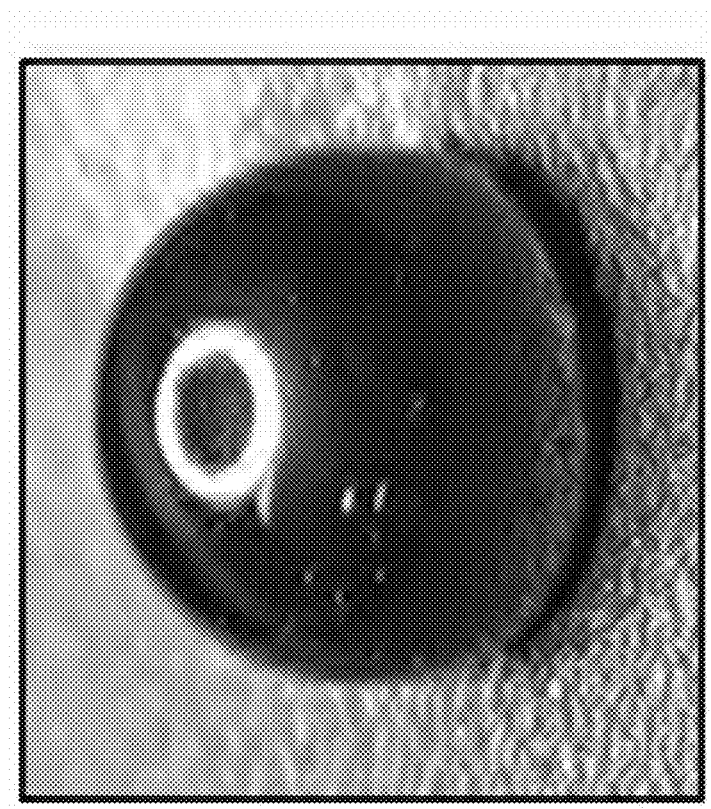
FIG. 11 is a photograph of an assembly for a fuel injector to which a coating method according to an embodiment of the present invention is applied.

Detailed steps of stacking the bonding layer 210, the support layer 220, and the SiO-DLC functional layer 230 will be described below with reference to FIG. 11.

The bonding layer 210 serves to bond the base material 100 and the support layer 220 to each other, and may be formed in a thickness range of 0.01 to 0.5 µm, and preferably at a thickness of 0.1 µm, but is not limited thereto.

When the thickness of the bonding layer 210 is less than 0.01 µm, a bonding force may be reduced, such that a problem in that durability is reduced may occur, and when the thickness of the bonding layer 210 exceeds 0.5 µm, a problem in that a coating time of 5 hours or more is required may occur, and a problem in that a hardness balance is lost in the coating material due to a thick film occurs, such that a problem in that durability is reduced (25% or more of thickness is lost) may occur.

The support layer 220 serves to support the bonding layer 210 and the SiO-DLC functional layer 230, and may be formed in a thickness range of 0.1 to 5 µm, and preferably at a thickness of 0.5 µm, but is not limited thereto.

When the thickness of the support layer 220 is less than 0.1 µm, an inter-layer hardness balance may be lost due to insufficiency of the thickness of the support layer, which may cause a problem in that durability is reduced (20% or more of thickness is lost), a local thickness loss problem, and a problem in that a abrasion mark (abrasion start point action) occurs. In addition, when the thickness of the support layer 220 exceeds 5 the coating time may be increased (5 hours or more), and it adversely affects SiO-DLC coating, such that a columnar structure (brittle structure) is formed, and a problem in that a residual stress in the layer is increased may thus occur.

The SiO-DLC functional layer 230 corresponds to the outermost layer of the coating material 200 according to the present disclosure, and serves as a functional layer having low friction, abrasion resistance, and heat resistance.

A thickness of the SiO-DLC functional layer 230 is 0.1 to 10 μm, and preferably 1.4 μm, but is not limited thereto.

When the thickness of the SiO-DLC functional layer 230 is less than 0.1 μm, abrasion and a friction coefficient are increased due to insufficiency of the thickness of the functional layer, such that a problem in that durability is reduced may occur, and when the thickness of the SiO-DLC functional layer 230 exceeds 10 μm, problems such as an increase in the coating time (5 hours or more), and an increase in a cost, and an increase in residual stress in the layer may occur.

Hereinafter, a jig 300 in the assembly for a fuel injector according to the present disclosure will be described with reference to FIGS. 5 and 6.

The jig 300 includes a support portion 310, an attractive force generating portion 320, and a plate 330. In this case, the support portion 310 is coupled to the plate 330 with a predetermined distance D interposed therebetween, and the attractive force generating portion 320 is coupled to the support portion 310.

The support portion 310 is provided to be transferred and coated in the chamber in a state where the base material 100 is mounted, and includes a support portion body 311 and a masking surface 312. In this case, the support portion body 311 is formed in a cylindrical shape at a predetermined thickness T, the masking surface 312 is formed at one end of the support portion body 311 in an axial direction and is in surface-contact with the base material 100, and the attractive force generating portion 320 is coupled to an opposite end of the support portion body 311 in the axial direction.

Meanwhile, in the present embodiment, the support portion 310 has a thickness T of between about 0.2 mm and 1.0 mm, and a height H of between about 2 mm and 12 mm, and has a width W so that a diameter of the uncoated region 120 is 0.8 mm or more and but less than a diameter of the base material 100.

When the thickness T of the support portion 310 is less than 0.2 mm, it is difficult to process the support portion and an processing error is large, such that a coating material is introduced into the jig 300, and when the thickness T of the support portion 310 exceeds 1.0 mm, a flow space of the coating material is reduced, such that coating efficiency is reduced. When the height H of the support portion 310 is less than 2 mm, a flow space of the coating material is insufficient, such that coating efficiency is reduced and it is difficult to remove the base material after coating the coating material, and when the height H of the support portion 310 exceeds 12 mm, a distance from the attractive force generating portion 320 is increased, such that fixing force for the base material 100 is reduced. When the width W of the support portion 310 is provided so that the diameter of the uncoated region 120 is less than 0.8 mm, the uncoated region 120 is insufficient, such that the coated region 110 is peeled off during laser welding, and when the diameter of the uncoated region 120 exceeds the diameter of the base material 100, the uncoated region 120 is excessively widened, such that durability and heat resistance are reduced.

The masking surface 312 is formed at one end of the support portion body 311 in the axial direction and is formed concavely inward in a radial direction so as to be in surface-contact with the base material 100. In this case, when the masking surface 312 formed concavely is formed to have a curvature corresponding to a curvature of the base material 100, a contact area between the masking surface 312 and the base material 100 is increased, and introduction of the coating material into the jig 300 is blocked.

Thus, in the support portion 310, the base material 100 is seated on the support portion body 311 having a cylindrical shape, and the uncoated region 120 of the base material 100 is covered with the masking surface 312. As a result, when the coating is carried out in a state where the base material 100 is mounted through the jig 300 of the present disclosure, there is an effect that the coating material is not deposited and formed on the uncoated region 120.

The attractive force generating portion 320 is formed in a cylindrical shape and is inserted into and provided in an opposite end (end in a direction opposite to the masking surface) of the support portion 310 in the axial direction. That is, the attractive force generating portion 320 is inserted into the hollow support portion 310 having the cylindrical shape.

The attractive force generating portion 320 has an effect of fixing the base material 100 by generating a magnetic field. That is, the base material 100 formed of a metal material is fixed to the support portion 310 by magnetic force generated from the attractive force generating portion 320.

Meanwhile, as in the present embodiment, a distance between the attractive force generating portion 320 and the base material 100 may be reduced due to the insertion of the attractive force generating portion 320 into the support portion, and magnetic force may be concentrated inside the support portion 310 due to the support portion 310 having the cylindrical shape. Thus, it is possible to reduce intensity of the magnetic force generated by the attractive force generating portion 320 in order to fix the base material 100. Therefore, the attractive force generating portion 320 may be miniaturized enough to be inserted into the support portion 310.

Figure 5:
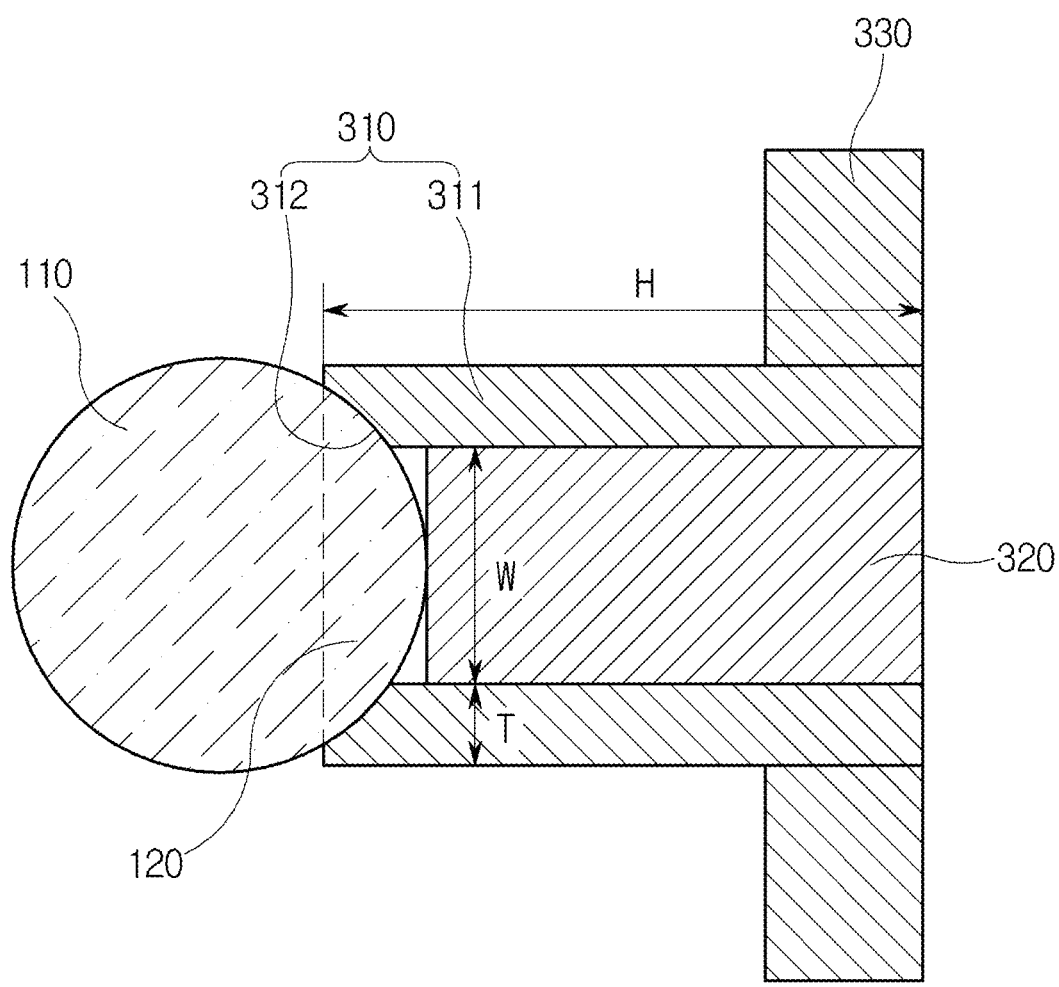
FIG. 5 is a schematic view of a coating jig of an assembly for a fuel injector according to an embodiment of the present disclosure.
Figure 6:
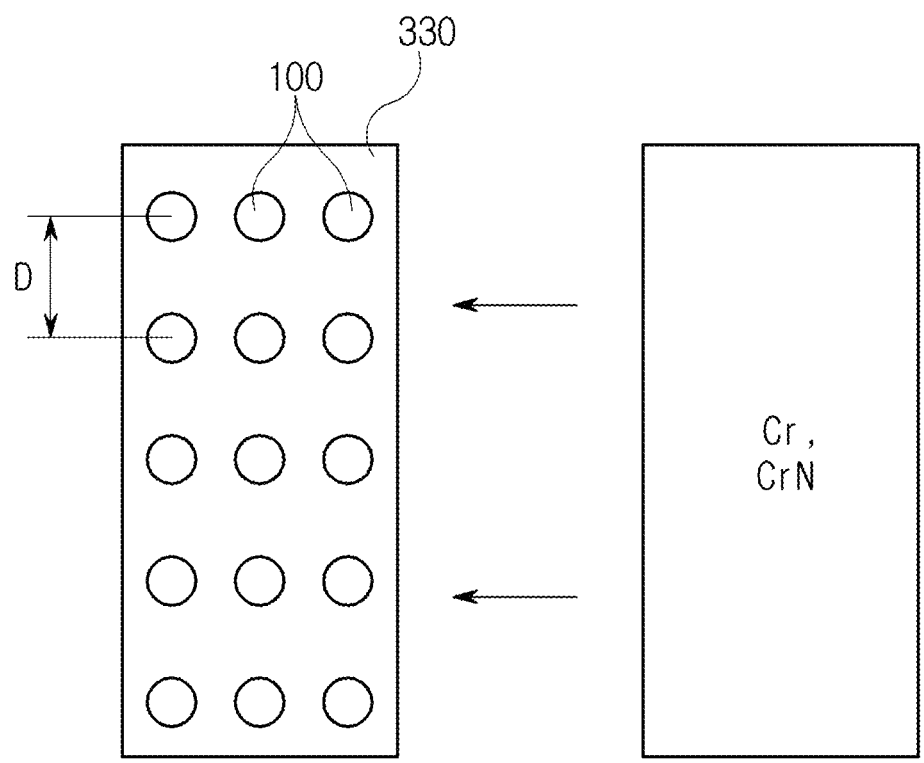
FIG. 6 is a schematic view for describing a process in which a base material is mounted and coated on the coating jig of an assembly for a fuel injector according to an embodiment of the present disclosure.
Figure 10:
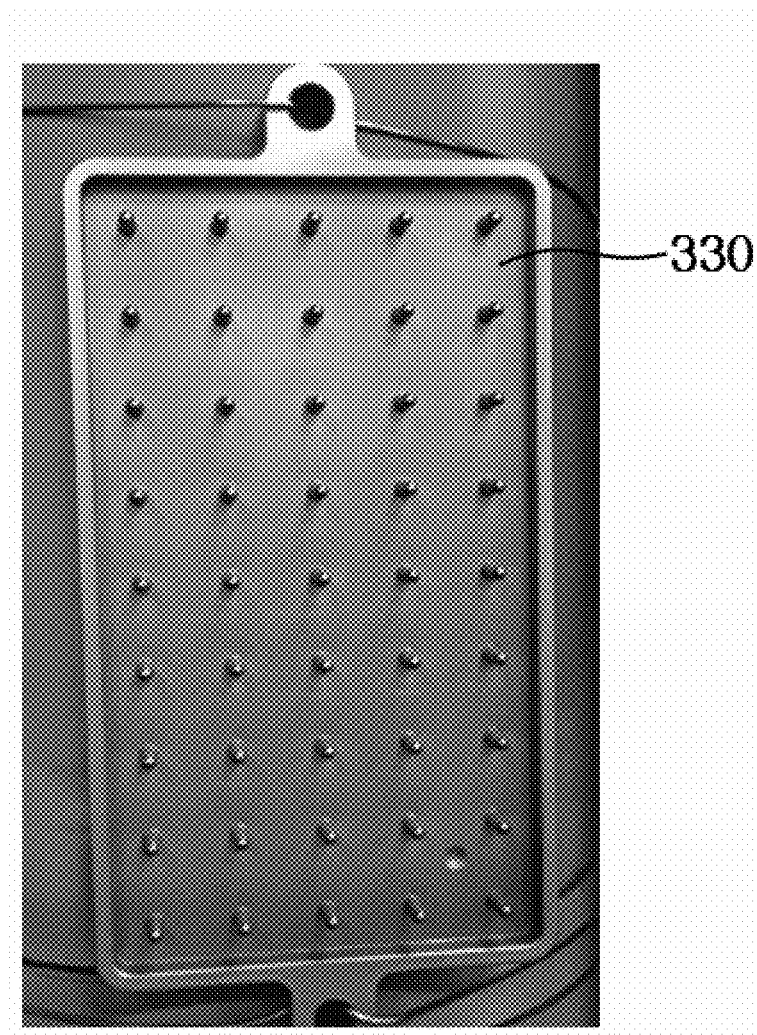
FIG. 10 is a photograph in a case of applying the coating jig of an assembly for a fuel injector according to an embodiment of the present disclosure.

Referring to FIGS. 5, 6 and 10, a plate 330 is provided in a flat plate shape, and a plurality of support portions 310 are coupled to the plate 330 at a predetermined distance D. In this case, in the present embodiment, the plurality of support portions 310 are disposed at a distance D of between about 5 mm and 15 mm, but are not limited thereto, and the distance D between the plurality of support portions 310 may be changed according to a shape and a size of the base material 100 as long as the flow space of the coating material is sufficiently guaranteed.

Figure 7:
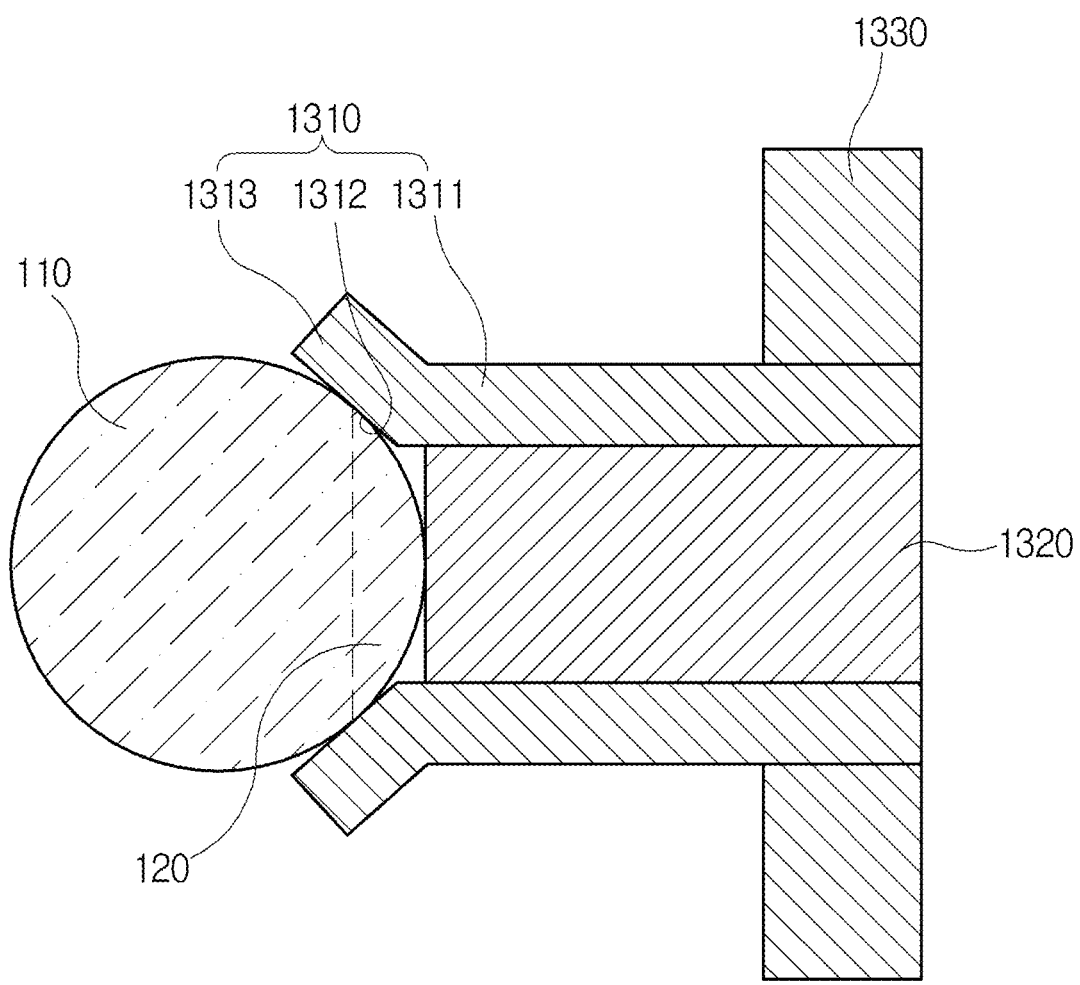
FIG. 7 is a schematic view of a coating jig of an assembly for a fuel injector according to another embodiment of the present invention.

Meanwhile, FIG. 7 illustrates a jig in an assembly for a fuel injector according to another embodiment of the present disclosure. A coating jig 1300 according to the present embodiment includes a support portion 1310, an attractive force generating portion 1320, and a plate 1330, wherein the support portion 1310 includes a support portion body 1311, a masking surface 1312, and an extending surface 1313.

Meanwhile, the support portion 1310, the attractive force generating portion 1320, the plate 1330, the support portion body 1311, and the masking surface 1312 according to the present embodiment have the same structures and functions as those of the support portion 310, the attractive force generating portion 320, the plate 330, the support portion body 311, and the masking surface 312 according to the embodiment of the present disclosure, and a detailed description thereof will thus be omitted.

In the present embodiment, the extending surface 1313 extends radially from the masking surface 1312, and is in contact with and supports the base material 100.

Thus, a type of support having a trumpet shape is formed through the masking surface 1312 and the extending surface 1313, and the base material 100 is mounted on the support, such that a support area of the base material 100 is increased. In addition, the extending surface 1313 may block introduction of the coating material to effectively prevent the coating material from being introduced into the target uncoated region 120.

Figure 8:
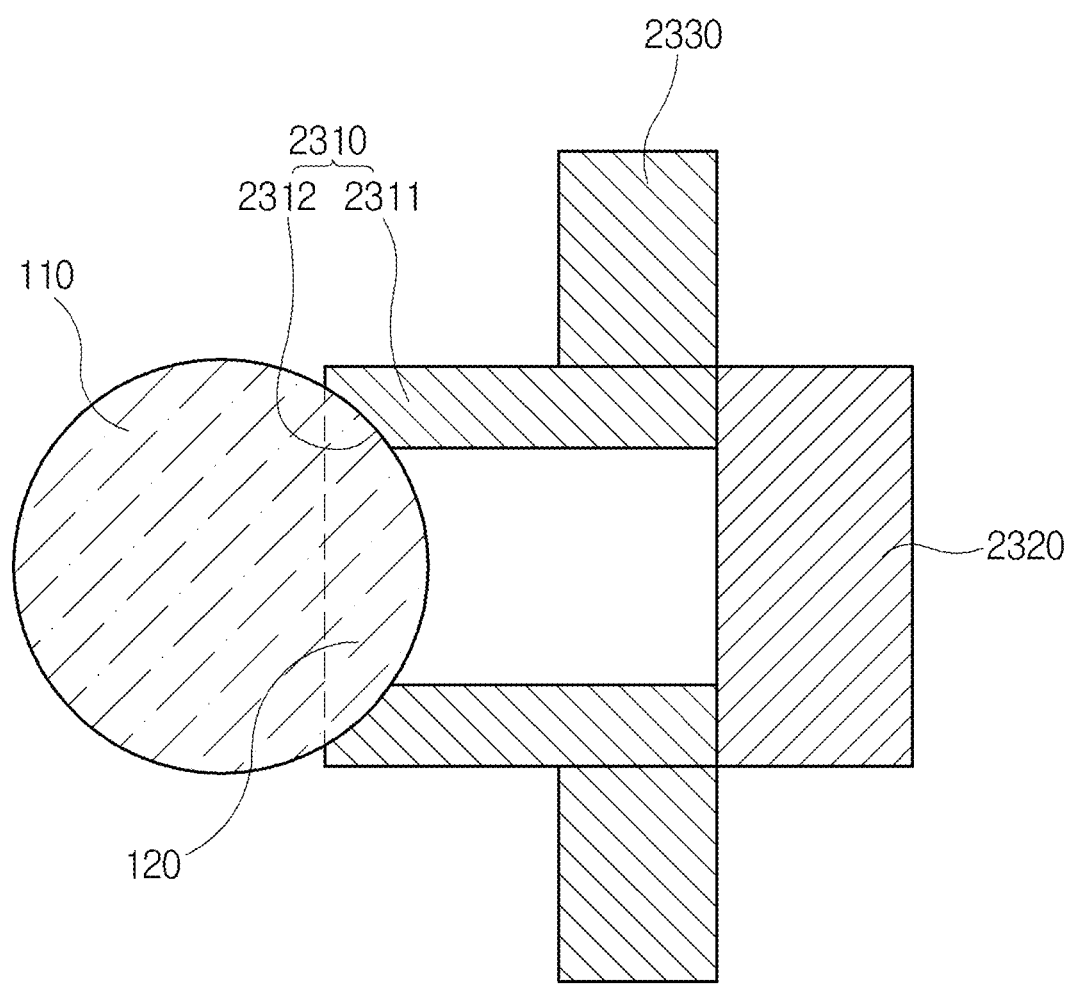
FIG. 8 is a schematic view of a coating jig of an assembly for a fuel injector according to still another embodiment of the present invention.

Meanwhile, FIG. 8 illustrates a jig in an assembly for a fuel injector according to still another embodiment of the present disclosure. A jig 2300 according to the present embodiment includes a support portion 2310, an attractive force generating portion 2320, and a plate 2330, wherein the support portion 2310 includes a support portion body 2311 and a masking surface 2312.

Meanwhile, the support portion 2310, the plate 2330, the support portion body 2311, and the masking surface 2312 of the present embodiment have the same structures and functions as those of the support portion 310, the plate 330, the support portion body 311, and the masking surface 312 according to an embodiment of the present disclosure, and a detailed description thereof will thus be omitted.

In the present embodiment, the attractive force generating portion 2320 is formed in a flat plate shape and is coupled to an opposite end of the support portion 2310 in the axial direction. In this case, it is easy to replace and assemble the attractive force generating portion 2320 depending on a shape of the component.

Figure 9:
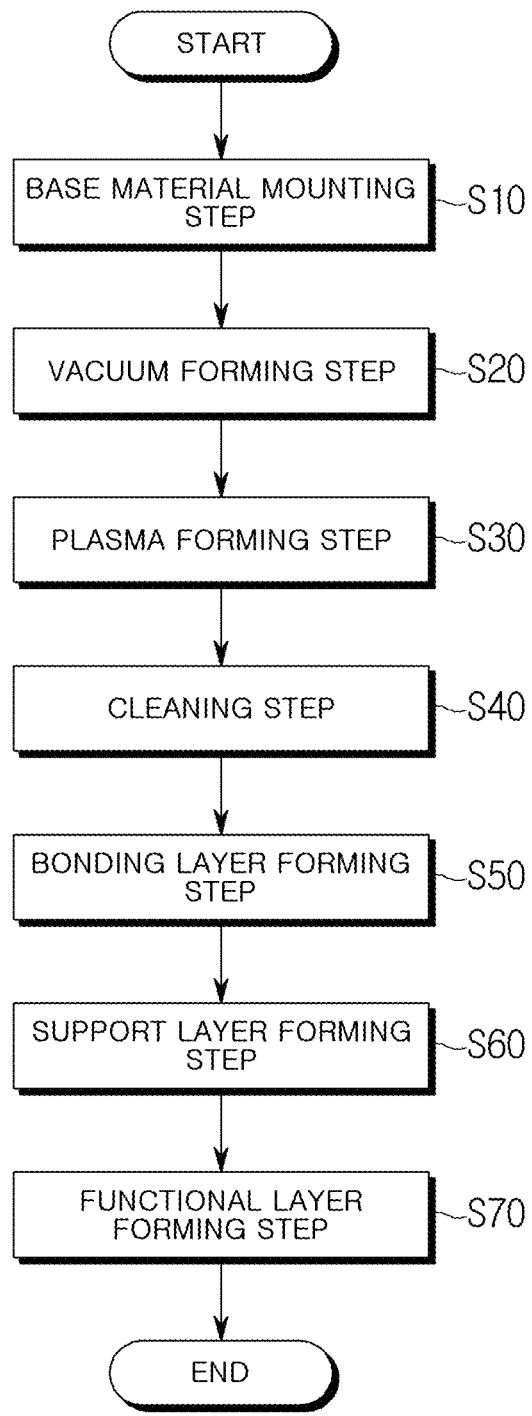
FIG. 9 is a flow chart for describing a method of coating the assembly for a fuel injector according to an embodiment of the present disclosure.

Hereinafter, each step of a coating method of an assembly for a fuel injector according to the present disclosure will be described with reference to FIG. 9.

The coating method of an assembly for a fuel injector includes a base material mounting step (S10), a vacuum forming step (S20), a plasma forming step (S30), a cleaning step (S40), a bonding layer forming step (S50), a support layer forming step (S60), and a functional layer forming step (S70).

First, in the base material mounting step (S10), the base material 100 is mounted on the jig 300. In this case, the jig 300 is provided with a magnet 120 (see FIG. 5), and attractive force by a magnetic field thus acts on the base material 100 formed of a metal material, such that the base material 100 is fixed to the jig 300. Thus, the base material 100 is partitioned into a coated region 110 that is exposed to the outside and an uncoated region 120 that is covered by the jig 300 and is not exposed to the outside, while being in contact with the jig 300 (S10).

In the vacuum forming step (S20), the jig 300 on which the base material 100 is mounted is disposed in a reaction chamber, and an internal atmosphere of the reaction chamber is formed and maintained in a vacuum state (S20).

Next, in the plasma forming step (S30), a plasma state where Ar ions are formed is formed by supplying an Ar gas as a process gas into the reaction chamber and increasing a temperature of the reaction chamber using a thermostat (S30).

Preferably, the inside of the reaction chamber is maintained at 80° C. using the thermostat.

Subsequently, in the cleaning step (S40), the base material surface is cleaned by applying a bias voltage to a bias electrode and accelerating so that Ar ions collide with the surface of the base material 100 (S40).

This is to increase bonding force between the coating material and the base material by preferentially performing an etching process for removing an oxidation layer and impurities naturally formed on the surface of the base material 100.

In addition, in this case, the bias voltage may be maintained in a range of 200 to 400 V. When the bias voltage is less than 200 V, an acceleration voltage of the Ar ions drops, such that hardness of the coating material may be reduced, and when the bias voltage exceeds 400 V, a lattice arrangement becomes irregular, such that close adhesion may be reduced.

After the step of cleaning the base material with the Ar ions (S40), the bonding layer formation step (S50) of forming the bonding layer 210 by stacking Cr ions on the surface of the base material by a physical deposition method, preferably a physical vapor deposition (PVD) method is performed.

Meanwhile, in the bonding layer forming step (S50) according to the present embodiment, the boding layer is formed in a sputtering manner. That is, Cr ionized by injecting an inert gas in a vacuum state and applying a negative voltage to Cr (target) to perform discharging, forms a thin film on the surface of the base material 100. In this case, the base material 100 is mounted on the jig 300, and a Cr bonding layer 20 is thus formed only on the surface of the coated region 110 exposed to the outside.

Meanwhile, in an embodiment different from the present embodiment, in the bonding layer forming step (S50), it is also possible to deposit Cr ions in a reactive sputtering manner and to form a bonding layer using Mo ions.

Next, the support layer forming step (S60) of stacking the support layer 220 on the outer surface of the bonding layer 210 formed in the bonding layer forming step (S50) by a physical deposition method, preferably a PVD method is performed.

In particular, in the support layer forming step (S60), the support layer 220 is formed by reacting Cr ions generated in a sputtering manner with N ions separated from nitrogen ($N_2$) gas injected as an active gas to form CrN particles and coating the CrN particles on the outer surface of the bonding layer 210, similar to the bonding layer forming step (S50), in a state where the stacking of the boding layer 210 is completed.

Meanwhile, in an embodiment different from the present embodiment, in the support layer forming step (S60), it is also possible to deposit CrN particles in a reactive sputtering manner and to form a support layer by reacting Mo ions with N ions and depositing MoN particles.

Next, the functional layer forming step (S70) of stacking the SiO-DLC functional layer 230 on the outer surface of the support layer 220 in a reactive sputtering manner is performed.

Specifically, in the functional layer forming step (S70), the SiO-DLC functional layer 230 is formed by physically depositing (PVD manner) solid graphite (C) as a target material under a temperature condition of 100° C. or more and 400° C. or less, and at the same time, injecting a hydrocarbon ($C_XH_Y$) gas and a siloxane gas as a reactive gas (a process gas).

In this case, when a process temperature is less than 100° C., bonding force of the functional layer is reduced, a durability reduction problem due to insufficiency of a thickness occurs, and a time required for a process is increased. On the other hand, when the process temperature exceeds 400° C., internal stress and deformation possibility occur due to a latent heat of the coating layer.

Meanwhile, methane ($CH_4$) or ethane ($C_2H_6$) is typically used as the hydrocarbon gas in the present embodiment, but the hydrocarbon gas is not limited thereto, and hexamethyldisiloxane (HMDSO) or octamethylcyclotetrasiloxane (OMCTS) is typically used as the siloxane gas, but the siloxane gas is not limited thereto.

In the DLC layer, a coating film is deposited on a surface by generating plasma in a vacuum state using a carbon-based gas, and a carbon film having a diamond-like structure is formed on the surface.

As a result, when the jig 300 according to the present disclosure is used and the coating method for a fuel injector according to the present disclosure is applied as illustrated in FIG. 10, it is possible to coat an assembly for an injector (see FIG. 11) in which friction reduction, high hardness, impact resistance, heat resistance and durability are improved by partitioning the coated region and the uncoated region from each other.

An assembly for an injector according to the related art has served to simply mount the base material and fix the base material so that the base material is coated in the chamber. Accordingly, the coating material was coated over the entire base material. In this case, when the assembly for an injector is coupled to another component by laser welding, a peeling phenomenon due to laser occurs in the coated region and generally, friction reduction, high hardness, impact resistance, heat resistance, and durability of the assembly for an inject are reduced.

On the other hand, in a case of the assembly for an injector to which the jig 300 according to the present disclosure is applied, an uncoated region is formed for a region where laser welding is to be performed, such that even though laser welding is performed, a delamination phenomenon may not occur, and friction reduction, high hardness, impact resistance, heat resistance, and durability of the assembly for an injector may be maintained.

Hereinafter, results of durability evaluation comparison and physical property evaluation comparison between an Example prepared by applying the coating method according to the present disclosure and Comparative Examples prepared according to the related art will be described.

EXAMPLE

First, the base material 100 having a spherical shape was mounted on the support portion 310 of the jig, a plasma state was created using an Ar gas in a state where an inside of a chamber is vacuum, and the inside of the chamber was heated to 80° C. to activate the surface of the base material 100 formed of SUS440C stainless steel. Thereafter, a bias voltage of 300 V was applied so that Ar ions collide with the surface of base material to clean the surface of the base material.

Thereafter, a bonding layer 210 formed of a Cr component was stacked at a thickness of 0.1 μm on the surface of the base material with Cr ions evaporated in a PVD manner.

Then, $N_2$, which is a process gas, was injected into the chamber, and reacted with the Cr ions evaporated from the Cr target to coat the support layer 220 of the CrN component at a thickness of 0.5 μm.

Thereafter, an SiO-DLC functional layer 230 was formed by depositing a solid graphite as a target material in a PVD manner, and at the same time, injecting a hydrocarbon gas and HMDSO gas into a reaction chamber.

Comparative Example 1

Unlike the Example according to the present disclosure, it was characterized in that the coating material was not formed on the base material. The base material was formed of SUS440C stainless steel as in the Example.

Comparative Example 2

A coating jig of an assembly for a fuel injector according to an embodiment of the present disclosure was used, a coating material having the same thickness as in the Example was formed on the SUS440C stainless base material, a Cr bonding layer was formed on a surface of the base material in a PVD manner, a CrN support layer was formed on an outer peripheral surface of the Cr bonding layer in a PVD manner, and then a SiO-DLC functional layer was formed on a surface of the CrN support layer in a plasma-assisted chemical vapor deposition (PACVD) manner.

Comparative Example 3

A coating jig of an assembly for a fuel injector according to an embodiment of the present disclosure was used, a coating material having the same thickness as in the Example was formed on the SUS440C stainless base material, a Cr bonding layer was formed on a surface of the base material in a PVD manner, a CrN support layer was formed on an outer peripheral surface of the Cr bonding layer in a PVD manner, and then a SiO-DLC functional layer was formed on a surface of the CrN support layer in a PVD manner.

Comparative Example 4

A coating jig of an assembly for a fuel injector according to an embodiment of the present disclosure was not used, a coating material having the same thickness as in the Example was formed on the SUS440C stainless base material in a state where the base material was simply mounted, a Cr bonding layer was formed on a surface of the base material in a PVD manner, and a CrN support layer was formed on an outer peripheral surface of the Cr bonding layer in PVD manner, and then a SiO-DLC functional layer was formed on a surface of the CrN support layer in a reactive sputtering manner.

Experiment for Durability Performance Evaluation

In order to evaluate the durability performance, a dry-run test was carried out. The dry-run test was an experiment for evaluating the durability of each coating material in a short period of time, and was carried out in the same manner under the following test conditions for the Examples and the Comparative Examples 1 to 3.

A test gas was air or nitrogen, supply pressure was 5 bar, test temperature was room temperature, PHID (Peak & Hold, 1.2 A & 0.6 A current control manner) was used as a driver stage, supply voltage was 14.0 V, pulse period was 5.0 ms, pulse width was 2.5 ms, and the operation time was 30 minutes or more.

It was checked visually whether there was any damage such as peeling off the surface of the coating material as a criterion for determination, and the coating thickness was evaluated.

For the coating thickness, an average value at two locations, 0° and 180° of the product and a thickness deviation of the coating materials at the two locations above were measured. The thickness was measured using a Calo tester.

TABLE 1

| Division | Example Cr/CrN/SiO-DLC | Comp. Example 1 SUS440C | Comp. Example 2 Cr/CrN/SiO-DLC | Comp. Example 3 Cr/CrN/SiO-DLC | Comp. Example 4 Cr/CrN/SiO-DLC |
|---|---|---|---|---|---|
| Thickness (um) | 2.0 | — | 2.0 | 1.0 | 0.9 |
| Coating time | <6 h | — | <6 h | <6 h | <6 h |
| Coating process | PVC & Reactive sputtering | — | PVD & PACVD | PVD & PVD | PVC & Reactive sputtering |
| Coating jig of the present disclosure | Used | — | Used | Used | Not used |
| Durability performance evaluation result (dry-run test) | Thickness: 7% loss Visual check: No abrasion marks | Large abrasion marks | Thickness: 25% loss Visual check: Abrasion mark found | Thickness: 21% loss Visual check: Abrasion mark found | Thickness: 32% loss Visual check: Abrasion mark found |

According to Table 1, it was confirmed that, as the result of the durability performance experiment, in the assembly for a fuel injector according to the Example of the present disclosure, the thickness of the coating material was lost by 7%, and no abrasion marks were found.

On the other hand, it was confirmed that, in the case of Comparative Example 2, the thickness of the coating material was lost by 25%, and abrasion mark was slightly found.

In addition, it was confirmed that, in the case of Comparative Example 3, the thickness of the coating material was lost by 21%, and abrasion mark was slightly found.

Further, it was confirmed that, in the case of Comparative Example 4, the thickness of the coating material was lost by 32%, and abrasion mark was slightly found.

Thus, as the result of testing the durability performance of the assembly for a fuel injector, it was confirmed that the Example of the present disclosure has a very low loss rate of the coating material as compared to the Comparative Examples, thereby having a very excellent durability performance.

Physical Property Evaluation

Physical property evaluation was carried out in order to evaluate physical properties of the coating material.

A plate on disk experiment was carried out using 10 N, 0.1 m/s, 2 km and a SUS440C pin in order to derive the friction coefficient.

A micro indenter (0.05 N, 0.7 μm indenting depth) was used in order to measure the hardness.

A scratch tester and a Rockwell C tester (HF1: high bonding force, HF5: low bonding force) were used in order to measure bonding force.

In addition, the adhesive force of the coating material according to the Example of the present disclosure was 37 N and was evaluated to be superior to the adhesive force of other Comparative Examples, particularly, the adhesive force of 33 N of Comparative Example 3. This evaluation is analyzed because a surface roughness of the Example deposited according to the reactive sputtering deposition method of the present application could be maintained very low.

In addition, the adhesive force of the coating material according to the Example can be evaluated as very excellent compared to the adhesive force of 27 N of Comparative Example 4. This evaluation is analyzed because the coating efficiency was increased by the use of the coating jig of the present application.

Although the present disclosure has been described in detail through specific embodiments for illustrative purposes, it is apparent that the present invention is not limited thereto, and can be modified or improved by those skilled in the art within the technical spirit of the present disclosure.

Any and all modifications and changes of the present disclosure should be considered to be within the scope of the invention, and the detailed scope of the present disclosure will be made clear by the accompanying claims.

What is claimed is:

1. An assembly for a fuel injector, comprising:
    a base material having a coated region and an uncoated region formed on a surface thereof; and
    a coating material stacked in a multilayer structure on the coated region, wherein the coating material includes:
    a bonding layer stacked on the coated region;

TABLE 2

| Division | Example Cr/CrN/SiO-DLC | Comp. Example 1 SUS440C (no coating) | Comp. Example 2 Cr/CrN/SiO-DLC | Comp. Example 3 Cr/CrN/SiO-DLC | Comp. Example 4 Cr/CrN/SiO-DLC |
|---|---|---|---|---|---|
| Vickers hardness (HV) | 2538 (24.1 GPa) | 772 (7.32 GPa) | 885 (8.4 GPa) | 1864 (17.7 GPa) | 1074 (10.2 GPa) |
| Heat resistance temperature | 400° C. | — | 400° C. | 400° C. | 400° C. |
| Roughness average, Ra (um) | 0.0332 | 0.2 | 0.0331 | 0.039 | 0.0358 |
| Dry friction coefficient | 0.10 | 0.45 | 0.12 | 0.13 | 0.11 |
| Oil friction coefficient | 0.05 | 0.22 | 0.06 | 0.07 | 0.06 |
| Adhesive force | HF 1 37N | — | HF 1-2 31N | HF 1-2 33N | HF 1-3 27N |

As shown in Table 2 above, it was confirmed that the Example of the present disclosure was measured to have an excellent hardness value and a relatively low friction coefficient, thereby reducing the friction coefficient as compared to the Comparative Examples.

a support layer stacked on an outer surface of the bonding layer; and
a silicon monoxide, diamond-like carbon (SiO-DLC) functional layer stacked on an outer surface of the support layer, wherein the uncoated region is formed to be partitioned from the coated region so as to prevent the coated region from peeling off during laser welding.

2. The assembly of claim 1, wherein the SiO-DLC functional layer is stacked in a reactive sputtering manner.

3. The assembly of claim 2, wherein the SiO-DLC functional layer is formed by physically depositing a solid graphite as a target material, and at the same time, injecting a hydrocarbon gas and a siloxane gas.

4. The assembly of claim 1, wherein the bonding layer and the support layer are stacked by a physical deposition method.

5. A coating jig for an assembly for a fuel injector contacted with a base material of the assembly for the fuel injector having a coated region and an uncoated region on a surface thereof to form a coating material including a bonding layer stacked on the coated region, a support layer stacked on an outer surface of the bonding layer, and an SiO-DLC functional layer stacked on an outer surface of the support layer, the coating jig comprising:
 a support portion having one end in an axial direction with and by which the base material having a spherical shape is in contact and is supported and provided so as to form the uncoated region in the base material; and
 an attractive force generating portion disposed on an opposite end of the support portion in the axial direction and generating a magnetic force so as to mount the base material;
 wherein the support portion includes:
  a support portion body formed in a cylindrical shape at a predetermined thickness; and
  a masking surface formed at one end of the support portion body in the axial direction and concavely formed so as to be in surface-contact with the base material to form the uncoated region on the base material.

6. The coating jig of claim 5, wherein the support portion further includes an extending surface extending radially from the masking surface so as to increase an area of the support portion supporting the base material.

7. The coating jig of claim 5, wherein the attractive force generating portion is inserted into and provided in the support portion.

8. The coating jig of claim 5, wherein the support portion has an outer diameter larger than 0.8 mm and smaller than a diameter of the base material.

9. The coating jig of claim 5, wherein the support portion has a thickness of between about 0.2 mm and 1.0 mm.

10. A coating method of an assembly for a fuel injector that stacks a coating material having a multilayer structure on a surface of a base material of an assembly for the fuel injector, the method comprising:

a mounting step of mounting the base material on a jig so as to partition a coated region and an uncoated region of the base material from each other;
 a bonding layer forming step of stacking a bonding layer on an outer peripheral surface of the base material;
 a support layer forming step of stacking a support layer on an outer surface of the bonding layer; and
 a functional layer forming step of stacking a silicon monoxide, diamond-like carbon (SiO-DLC) functional layer on an outer surface of the support layer,
 wherein the jig comprises:
  a support portion having one end in an axial direction with and by which the base material having a spherical shape is in contact with so as to form the uncoated region in the base material; and
  an attractive force generating portion disposed on an opposite end of the support portion in the axial direction and generating a magnetic force so as to mount the base material.

11. The coating method of claim 10, wherein in the functional layer forming step, the SiO-DLC functional layer is stacked in a reactive sputtering manner.

12. The coating method of claim 11, wherein in the functional layer forming step, the SiO-DLC functional layer is formed using a solid graphite, a hydrocarbon gas, and a siloxane gas.

13. The coating method of claim 12, wherein in the functional layer forming step, a solid graphite is deposited as a target material in a PVD (physical vapor deposition) manner, and at the same time, a hydrocarbon gas and a siloxane gas are injected as a reactive gas.

14. The coating method of claim 10, wherein in the bonding layer forming step and the support layer forming step, the bonding layer and the support layer are stacked by a physical deposition method.

15. The coating method of claim 10, further comprising:
 a vacuum forming step of maintaining an internal atmosphere of a reaction chamber in a vacuum state in a state where the base material is disposed in the reaction chamber, after the mounting step;
 a plasma forming step of forming a plasma state where argon (Ar) ions are generated, by injecting an argon (Ar) gas into the reaction chamber and raising a temperature of the reaction chamber; and
 a cleaning step of cleaning a surface of the base material by colliding the Ar ions with the surface of the base material.

16. The coating method of claim 10, wherein in the base material mounting step, the base material is fixed by a magnetic force of the jig.

* * * * *